United States Patent [19]

Dunkley

[11] 3,901,735

[45] Aug. 26, 1975

[54] INTEGRATED CIRCUIT DEVICE AND METHOD UTILIZING ION IMPLANTED AND UP DIFFUSION FOR ISOLATED REGION

[75] Inventor: James L. Dunkley, Santa Clara, Calif.

[73] Assignee: National Semiconductor Corporation, Santa Clara, Calif.

[22] Filed: Sept. 10, 1973

[21] Appl. No.: 395,574

[52] U.S. Cl. .................... 148/1.5; 148/186; 357/44; 357/91

[51] Int. Cl.[2] ........................................ H01L 21/265

[58] Field of Search .......... 148/1.5, 186; 357/44, 91

[56] References Cited

UNITED STATES PATENTS

| | | | |
|---|---|---|---|
| 3,502,951 | 3/1970 | Hunts | 148/186 X |
| 3,729,811 | 5/1973 | Beale et al. | 148/1.5 X |
| 3,793,088 | 2/1974 | Eckton, Jr. | 148/1.5 |

*Primary Examiner*—L. Dewayne Rutledge
*Assistant Examiner*—J. M. Davis

[57] ABSTRACT

An integrated circuit device including a transistor within an isolation region, said isolation region being formed by an ion implantation of a first conductivity type dopant into the device substrate of said first conductivity type, an epitaxial layer of a second conductivity type being grown on said substrate, and a second portion of said isolation region being formed by a diffusion of said first conductivity type dopant down through the epitaxial layer, said ion implanted dopant diffusing up to overlap with the down diffusion dopant to form the isolation region. Several forms of transistors including lateral devices and vertical devices are included on the integrated circuit device.

19 Claims, 7 Drawing Figures

INTEGRATED CIRCUIT DEVICE AND METHOD UTILIZING ION IMPLANTED AND UP DIFFUSION FOR ISOLATED REGION

BACKGROUND OF THE INVENTION

In the fabrication of lateral transistors on an integrated circuit where the transistor is to be employed in a high voltage application, for example 50 volts, it is necessary that the epitaxial layer serving as the collector region be relatively thick, for example 20μ. This thickness provides space for the depletion layer to spread. However, this thickness also dictates a deep isolation diffusion, the isolation diffusion also speading laterally as it diffuses vertically. For high voltage application, it is necessary that the base region be spaced laterally a sufficient distance from the isolation region so that, as the reverse bias is applied to the collector-base junction and the collector area becomes depleted of carriers, the depletion layer will extend over as far as the isolation region. If the depletion layer should reach the isolation area, current will be passed from the base to the substrate, acting like a short circuit.

Because of the lateral spreading of the isolation region during the deep isolation diffusion, and because of the need to maintain sufficient spacing between the isolation region and the base diffusion, a substantial area of the chip is taken up by each such transistor. For example, the distance between the edge of the mask opening on the wafer surface for the deep isolation diffusion and the edge of the mask opening for the base diffusion is of the order of 1.6 mils to allow for proper spacing between the isolation and collector region junction and the base and collector region junction.

SUMMARY OF THE PRESENT INVENTION

The present invention provides a transistor in an IC circuit, and method for fabrication thereof, which can be employed in high voltage applications, and in which the epitaxially grown collector region can be relatively thin, with isolation diffusion regions of relatively narrow lateral dimensions. Because of the relatively thin isolation region widths, less chip area is occupied by each such transistor.

In a preferred embodiment of the invention, prior to the growth of the epitaxial layer on the semiconductor substrate, an ion implantation of isolation dopant is made into the substrate at the position of the isolation regions. With ion implantation, the peak concentration of the dopant occurs below the surface of the substrate and, because of the low concentration of isolation dopant on the surface of the substrate, this isolation dopant does not adversely affect the epitaxial layer. The epitaxial layer may be almost one half the thickness of the epitaxial layer of the prior devices. An isolation diffusion is then made into the surface of the epitaxial layer, the heat during the processing of this isolation diffusion causing the ion implanted dopant in the substrate to diffuse upwardly toward the isolation diffusion taking place at the surface of the epitaxial layer. The two isolation regions diffuse toward each other until they overlap and form the unitary deep isolation diffusion reaching through the entire epitaxial layer down to the substrate.

Since the isolation diffusion from the surface of the epitaxial layer need extend only part way through the epitaxial layer before it contacts the upwardly diffusing isolation dopant, the lateral diffusion at the surface is restricted to a narrower region than before, and therefore substantially less area on the chip is taken up by the isolation region.

Several different forms of lateral and vertical transistors may be formed utilizing the novel isolation up technique.

DESCRIPTION OF THE PREFERRED EMBODIMENTS

Figure 1:
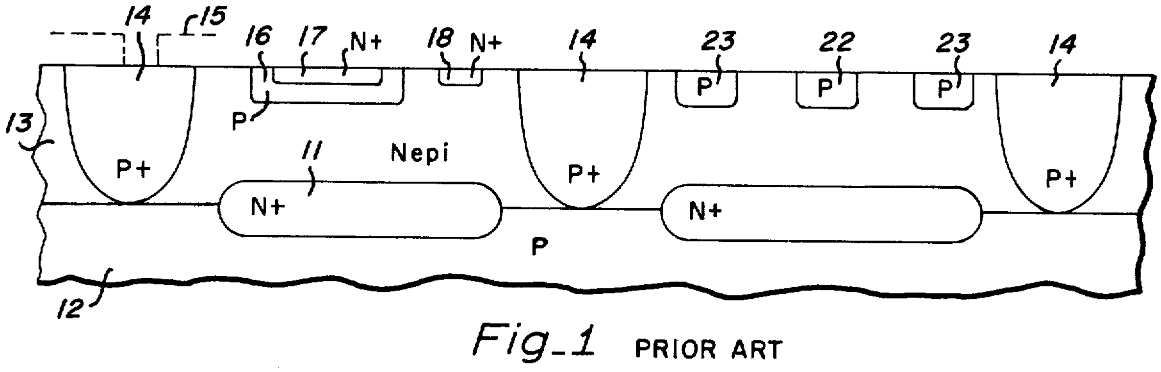
Fig 1 PRIOR ART
FIG. 1 is a cross section view of a prior art form of integrated circuit device showing a high voltage NPN transistor on the left and another lateral PNP transistor on the right.

Referring now to FIG. 1 there is shown a portion of an integrated circuit device in which a known form of high voltage handling transistor is shown on the left hand side and a known form of lateral transistor is shown on the right hand side. Although the main thrust of the invention is the improvement in the high voltage handling transistor, the associated lateral transistor is shown to aid in illustrating the improvement that may be made in such a lateral transistor as a result of the novel technique used to enhance the high voltage transistor. The novel invention as it relates to the high voltage transistor will be described first, since this invention is independent of benefits to other devices that may be on the same chip.

The known form of high voltage handling transistor is fabricated by first diffusing an N+ material 11 into the P substrate 12 in each region where such a transistor is to be formed, this N+ diffusion serving as the buried layer beneath the collector region. An N layer 13 is then epitaxially grown on the substrate 12, and because of the high voltages to be handled, for example 50 volts, the N epitaxial layer 13 must be relatively thick, for example 20μ.

It is then necessary to diffuse the P+ transistor isolation regions 14 into the surface of the N epitaxial layer 13 and deep down through this layer until they reach the P substrate 12. Conventional oxide layer and photo resist techniques are used to form the mask on the N epitaxial layer surface to define the isolation regions, and a portion of the mask 15 is shown in dotted line form. The isolation diffusion is carried on at temperatures between 1200°C – 1300°C and, because of the depth desired, for example 23μ, the time of diffusion is between three and twelve hours. While diffusing deeply, the isolation dopant also diffuses laterally under the mask 15 a distance proportionally related to the depth, and thus spreads laterally to a substantial extent. Also, because of the high temperature and the length of time needed for the deep isolation diffusion, the N+ dopant in buried layer 11 diffuses vertically up into the N epitaxial layer 13 a substantial distance, for example 6$\mu$, a factor that figures into the need for a thick N epitaxial layer 13.

After the isolation diffusion, the P base region 16 is diffused into the surface of the N layer 13, followed by the diffusion of the N+ emitter 17 and the N+ collector contacting region 18 into the N epitaxial collector region.

To permit room for the depletion layer to spread through the layer 13 during high voltage use, it is also necessary that the base region 16 be spaced laterally a substantial distance from the nearest point of the P+ isolation region 14. As reverse biasing is applied on the collector-base junction and the depletion of the carriers in the collector region commences, the depletion layer must not extend over to the isolation region 14 or current will be passed from the base 16 to the substrate. A typical lateral distance between the base 16 nd the nearest point of the isolation region 14 is about 0.5 mils. This distance, coupled with the lateral spread of the isolation region 14, results in consuming a large surface area of the chip for the transistor. Typically the distance between the mask opening for the isolation diffusion and the nearest point of the opening in a later mask for the base diffusion is about 1.6 mils and, since many such transistors may be formed on a chip, a substantial surface area is taken up due to this spacing.

Figure 2:
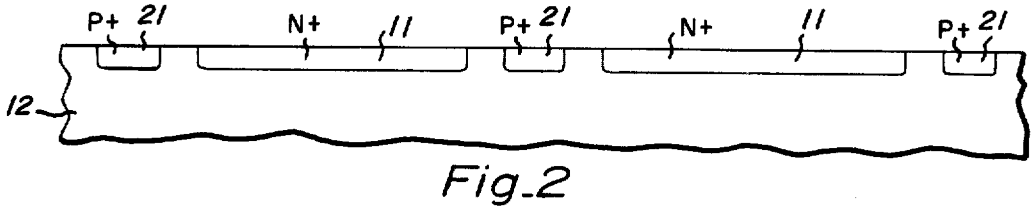
FIGS. 2 and 3 show two stages in the fabrication of an IC circuit with an improved form of high voltage NPN transistor on the left and an improved PNP transistor on the right.

Referring now to FIG. 2, the novel transistor of the present invention is fabricated by first diffusing the N+ type dopant layer 11, for example antimony, into the P substrate body 12 at each location of a high voltage transistor. Thereafter, a suitable oxide mask is formed exposing areas of the substrate 12 where the P type isolation regions are to be formed. A P+ type material, such as boron, is then implanted into these regions 21 of the substrate 12 by the well known ion implantation technique (see, for example, the article by J. F. Gibbons, Proceedings of IEEE, Vol. 56, page 29, 1968).

An ion implantation apparatus of known type includes a means for applying a high voltage alternating electrical field, for example, 15 KEV, on a gas containing the doping atom desired, for example boron in the gas $BH_2$, to ionize the boron in the gas. The gas is accelerated through a mass separator including a magnetic field to separate out the ionized boron atoms and direct them through a linear accelerator with an accelerating potential of from 20 KEV to 150 KEV. Higher energies can also be used to advantage if made to be compatible with the process technology. The beam of positive boron atoms exits the accelerator and is swept over the silicon wafer surface to implant the boron ions in the regions 21 defined by the openings in the oxide mask. The beam of ionized boron atoms can be monitored very accurately so that the amount of boron atoms implanted and also the exact depth of the implant layer can be controlled very accurately by proper selection of the accelerating voltage. The impurity profile of the boron peaks at a point below the surface of the substrate 12, for example 0.6$\mu$ deep. A typical concentration for the peak of the P+ implant is about $10^{19}/cm^3$ with a surface concentration of about $10^{16}/cm^3$.

The isolation mask is then removed and the N epitaxial layer 13 (see FIG. 3) is grown on the surface of the substrate 12 in well known manner. With this improved device, the N epitaxial layer is of the order of 13$\mu$ thick.

Since the boron dopant in regions 21 has its maximum concentration below the surface of substrate 12, with a lesser concentration at the surface, the boron dopant does not diffuse or out gas into the growing epitaxial layer 13 in sufficient quantity to compensate the N epitaxial layer, i.e. to increase the resistivity of the layer, so as to degrade the characteristics of the device. Certain prior art devices were manufactured with portions or regions of the isolation areas such as 21 having the isolation dopant such as boron diffused therein. However, the diffusion resulted in the maximum concentration of dopant on the surface and, during the N epitaxial layer growth, the boron out gassed and compensated the N epitaxial layer. In fact, in some cases, a P layer or film was formed in the epitaxial layer just above the N+ buried layer which ruined the operation of the device. As noted, with the ion implanted dopant, very few boron atoms out gas as a result of the heat applied during the short time of the N epitaxial layer growth, a heat of about 1140° C for a period of about 10 to 15 minutes.

As a next step, an oxide mask is again formed on the N epitaxial layer 13 with openings in the isolation regions and boron is diffused into these regions 14 in a normal manner. During the high temperature (a typical value of 1200°C) oxidation step and during the high temperature (a typical value of 1200°C) isolation diffusion step, a total time of about 2 hours, the boron in the ion implanted regions 21 diffuses up into the epitaxial layer 13 so that, during the down diffusion of boron 14, the up diffusion overlaps the down diffusion and forms a continuous P+ isolation region through the N epitaxial layer 13.

Since the down diffusion 14 needs to travel a substantially lesser distance than with the device of FIG. 1, there is substantially less lateral diffusion of the isolation material, with smaller isolation region cross-section.

The standard P base diffusion 16 and N+ emitter 17 and collector connection region 18 diffusion steps are then completed. Although the normal distance through the epitaxial layer 13 between the P base 16 and isolation region 14 is maintained, the distance between isolation mask opening and P base mask opening is reduced to about 1 mil.

It is also noted that, since the time taken for the p+ isolation 14 diffusion is less, the N+ layer 11 diffuses a shorter distance up into the N epitaxial layer, a factor leading to the use of the thinner N epitaxial layer.

This ion implantation type of isolation-up process results in fabrication techniques improving the operation of other types of devices on the same chip. For example, a lateral type transistor is shown in FIG. 1 comprising a central emitter region 22 surrounded by a collector region 23 with the N epitaxial layer 13 serving as the base region. The emitter region 22 and collector region 23 are formed during the P base diffusion 16 of the high voltage transistor. The associated N+ buried layer and P+ isolation regions are formed during formation of the similar regions in the high voltage transistor. Because the emitter 22 is formed during the base diffusion 16, the emitter region 22 is relatively lightly doped, for example $10^{18}/cm^3$. However, since the beta of a transistor depends on the doping of the emitter, it is preferred to have a heavily doped emitter region, for example $10^{21}/cm^3$.

Figure 3:
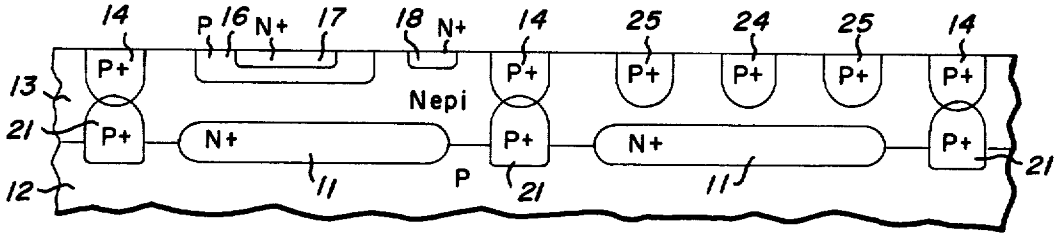

In the device of FIG. 3, the lateral transistor is formed by the P+ central emitter 24 and the surrounding P+ collector 25 which are diffused into the N epitaxial layer 13 during the isolation down diffusion 14 rather than later during the P base diffusion 16. Since the emitter 24 is now heavily doped, the lateral transistor has an improved beta figure.

Figure 4:
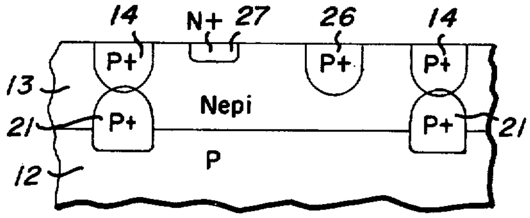
FIG. 4 shows an improved form of vertical PNP transistor utilizing the present improvements in IC devices.

In the prior art device of FIG. 1, a vertical PNP transistor may also be formed on the chip with a P type emitter formed in the surface of the N epitaxial layer 13 during the base diffusion forming base 16, and with the N epitaxial layer serving as the base region and the P substrate 12 serving as the collector. With this novel invention, an improved PNP vertical transistor can be formed on the device of FIG. 3, and this improved device is shown in FIG. 4. In this vertical PNP, the emitter 26 is formed during the isolation region formation when the isolation regions 14 are formed. Thereafter, the N+ collector connection region 27 is formed. The narrower base region provided by the narrower N epitaxial layer 13 improves the frequency response of this transistor and also the beta. In addition, the use of the P+ plug 26 for the emitter, as opposed to a base diffusion P emitter, improves the beta of this transistor. Both the lateral PNP of FIG. 3 and the vertical PNP of FIG. 4 will operate at higher emitter current densities as a result of using the isolation region 14 as the emitter.

Figure 5:
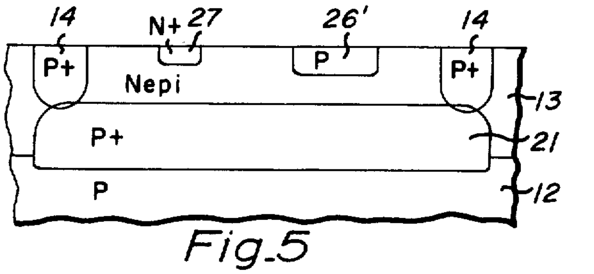
FIG. 5 shows another improved frm of vertical PNP realized in the present invention.

Another form of vertical PNP transistor is shown in FIG. 5 wherein the ion implanted P+ layer 21 extends completely between the two isolation regions 14 so that, during the up-diffusion of the layer 21 to meet the down diffusion of the isolation regions 14, the up diffusing layer 21 decreases the depth of the N epi layer 13 in the region of the lateral PNP transistor. The P type emitter 26′ is formed during the P diffusion of base region 16. This narrowing of the base region formed by the N epitaxial layer 13 improves the frequency response and the beta of this vertical PNP transistor.

Figure 6:
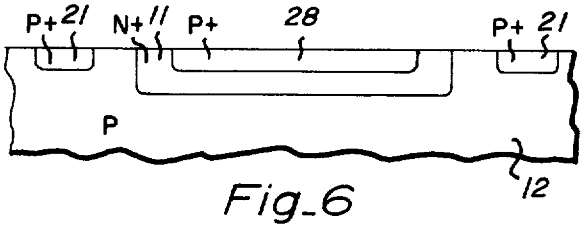
FIGS. 6 and 7 show two steps in the fabrication of a vertical type transistor wherein the collector connection is made on the surface.
Figure 7:
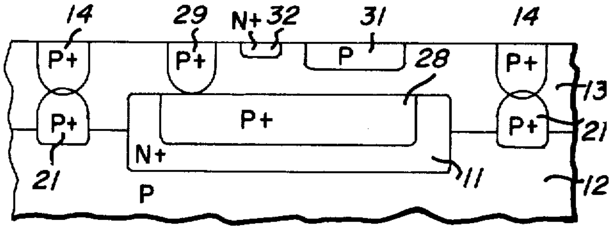

There is shown in FIGS. 6 and 7 another improved form of vertical PNP transistor that may be formed on the device of FIG. 3 as a result of the use of the novel ion implantation iso-up technique. A first stage of fabrication of this vertical type PNP transistor is shown in FIG. 6 wherein the N+ layer 11 which is to serve as the N+ buried layer is first diffused into the P substrate. The isolation regions 21 are then formed by the ion implantation process described above, and at the same time a P+ ion implanted layer 28 is also formed in the N+ layer 11.

Referring to FIG. 7, the N epitaxial layer 13 is then grown on the surface of the substrate. The P+ isolation regions 14 are then diffused into and down through the epitaxial layer until they overlap with the up diffusing P+ regions 21 to form the isolation bands. At the same time, a P+ plug 29 is diffused into the N epitaxial layer and diffuses downwardly until it reaches the P+ layer 28 which is diffusing upwardly. The P+ layer 28 is isolated from the P substrate 12 by the N+ buried layer region 11, and the P+ plug 29 serves as a connection region to the surface for the P+ layer 28. Thereafter, the emitter region 31 is formed during the P base diffusion of base 16, and the N+ base connection region 32 is formed during formation of the N+ collector connection region 18.

There is thus formed a vertical PNP transistor in which the collector is formed by an ion implanted region 28 rather than the P substrate as before. This P+ collector region 28 is then connected by plug 29 from the surface of the device rather than the normal underside connection to the P substrate 12. Any desired potential connection may be made to the collector via plug 29 rather than the normal ground connection made via the common substrate region 12.

Although the invention has been described as it relates to an NPN high voltage transistor and related PNP devices, it should be understood that devices of the opposite conductivity may be made using the same ion implanted iso-up technique. In such case, the ion implantation dopant would be N+ material such as phosphorus atoms.

What is claimed is:

1. The method for making a transistor in the semiconductor substrate of an integrated circuit device comprising the steps of forming a first portion of an isolation region of a first conductivity type in a semiconductor substrate of said first conductivity type by the ion implantation of a dopant of said first conductivity type into the surface of the substrate, growing an epitaxial layer of a second conductivity type on the surface of said substrate and over said ion implanted region, forming a second portion of said isolation region in said epitaxial layer by the diffusion of a dopant of said first conductivity type down into the epitaxial layer, said ion implanted dopant diffusing from said substrate up into said epitaxial layer until said down diffusion and said up diffusion overlap, forming the base region of said transistor by diffusion of a dopant of said first conductivity type in said epitaxial layer, and forming the emitter region of said transistor by the diffusion of a dopant of said second conductivity type into said base region.

2. The method as claimed in claim 1 wherein said first conductivity type is P type and said second conductivity type is N type.

3. The method as claimed in claim 1 including also making a lateral transistor on said substrate spaced apart from said transistor comprising the steps of forming an emitter region and a collector region in said epitaxial layer by the diffusion of said dopant of said first conductivity type down into said epitaxial layer at the time of forming said second portion of said isolation region.

4. The method as claimed in claim 3 wherein said first conductivity type is P type and said second conductivity type is N type.

5. The method as claimed in claim 1 including also making a vertical transistor on said substrate spaced apart from said transistor comprising the steps of forming an emitter region in said epitaxial layer by the diffusion of said dopant of said first conductivity type down into said epitaxial layer at the time of forming said second portion of said isolation region, said epitaxial layer serving as the base region and said substrate serving as the collector region for the vertical transistor.

6. The method as claimed in claim 5 wherein said first conductivity type is P type and said second conductivity type is N type.

7. The method as claimed in claim 1 including also making a vertical transistor on said substrate spaced apart from said transistor comprising the steps of forming a collector region in said substrate layer by the ion implantation of said dopant of said first conductivity type in said substrate at the time of forming said first portion of said isolation region in said substrate, said epitaxial layer formed on said substrate serving as the base region and said substrate and ion implanted collector region serving as the collector region for the vertical transistor, and forming an emitter region in said epitaxial layer by the diffusion of a region of said first conductivity type into said epitaxial layer at the time of formation of said first base region.

8. The method as claimed in claim 7 wherein said first conductivity type is P type and said second conductivity type is N type.

9. The method as claimed in claim 1 including also making a vertical transistor on said substrate spaced apart from said transistor comprising the steps of diffusing a heavily doped buried layer region of said second conductivity type into said substrate prior to said ion implantation, forming a collector layer within said heavily doped buried layer region by the ion implantation of a layer of said first conductivity type at the time of formation of said ion implanted first portion of said isolation region, said epitaxial layer being grown over said latter two layers, forming a collector connection plug down through said epitaxial layer and into contact with said ion implanted collector layer, forming an emitter region in said epitaxial layer by the diffusion of a dopant of said first conductivity type during formation of said first base region, said epitaxial layer serving as the base region and said collector layer serving as the collector region for the vertical transistor, and forming a base connection region to said epitaxial layer.

10. The method as claimed in claim 9 wherein said first conductivity type is P type and said second conductivity type is N type.

11. The method for making a transistor in the semiconductor substrate of an integrated circuit device, said substrate being of a first conductivity type, comprising the steps of diffusing a heavily doped buried layer region of a second conductivity type material into the surface of a semiconductor substrate, forming a first portion of an isolation region in said substrate by the ion implantation of a dopant of said first conductivity type, growing an epitaxial layer of said second conductivity type on the surface of said substrate, forming a second portion of said isolation region in said epitaxial layer by the diffusion of a dopant of said first conductivity type down into the epitaxial layer, said ion implanted dopant diffusing from said substrate up into said epitaxial layer until said down diffusion and said up diffusion overlap, forming the base region of said transistor by diffusion of a dopant of said first conductivity type in the surface of said epitaxial layer, forming the emitter region of said transistor by the diffusion of a dopant of said second conductivity type into said base region, and forming a collector connection region in the surface of said epitaxial layer by the diffusion of a dopant of said second conductivity type into the surface of said epitaxial layer.

12. The method as claimed in claim 11 wherein said first conductivity type is P type and said second conductivity is N type.

13. The method as claimed in claim 11 including also making a lateral transistor on said substrate spaced apart from said transistor comprising the steps of forming a second emitter region and an associated collector region in said epitaxial layer by the diffusion of said dopant of said first conductivity type down into said epitaxial layer at the time of forming said second portion of said isolation region.

14. The method as claimed in claim 13 wherein said first conductivity type is P type and said second conductivity type is N type.

15. The method as claimed in claim 11 including also making a vertical transistor on said substrate spaced apart from said transistor comprising the steps of forming an emitter region in said epitaxial layer by the diffusion of said dopant of said first conductivity type down into said epitaxial layer at the time of forming said second portion of said isolation region, said epitaxial layer serving as the base region and said substrate serving as the collector region for the vertical transistor.

16. The method as claimed in claim 15 wherein said first conductivity type is P type and said second conductivity type is N type.

17. The method as claimed in claim 11 including also making a vertical transistor on said substrate spaced apart from said transistor comprising the steps of forming a collector region in said substrate layer by the ion implantation of said dopant of said first conductivity type in said substrate at the time of forming said first portion of said isolation region in said substrate, said epitaxial layer formed on said substrate serving as the base region and said substrate and ion implanted collector region serving as the collector region for the vertical transistor, and forming an emitter region in said epitaxial layer by the diffusion of a region of said first conductivity type into said epitaxial layer at the time of formation of said first base region.

18. The method as claimed in claim 11 including also making a vertical transistor on said substrate spaced apart from said transistor comprising the steps of diffusing a heavily doped buried layer region of said second conductivity type into said substrate prior to said ion implantation, forming a collector layer within said heavily doped buried layer region by the ion implantation of a layer of said first conductivity type at the time of formation of said ion implanted first portion of said isolation region, said epitaxial layer being grown over said latter two layers, forming a collector connection plug down through said epitaxial layer and into contact with said ion implanted collector layer, forming an emitter region in said epitaxial layer by the diffusion of a dopant of said first conductivity type during formation of said first base region, said epitaxial layer serving as the base region and said collector layer serving as the collector region for the vertical transistor, and forming a base connection region to said epitaxial layer.

19. The method as claimed in claim 18 wherein said first conductivity type is P type and said second conductivity type is N type.

* * * * *